United States Patent [19]
Weiler

[11] Patent Number: 5,999,410
[45] Date of Patent: Dec. 7, 1999

[54] FLEXIBLE CIRCUIT BOARD CONFIGURABLE FOR USE WITH DIFFERENT TYPES OF BATTERY PACKS

[75] Inventor: Allan P. Weiler, Crete, Nebr.

[73] Assignee: Centurion International, Inc., Lincoln, Nebr.

[21] Appl. No.: 09/124,740

[22] Filed: Jul. 29, 1998

[51] Int. Cl.⁶ ............................... H02J 7/00; H05K 1/18
[52] U.S. Cl. ...................... 361/749; 361/781; 361/782; 361/811; 320/110; 320/138; 307/150
[58] Field of Search ................... 361/736, 738, 361/749–751, 777, 778, 781–783, 806, 811, 820; 338/319, 320, 210–212, 220, 221; 174/254, 260, 261, 262; 320/125, 110, 138; 307/150

[56] References Cited

U.S. PATENT DOCUMENTS

| | | | |
|---|---|---|---|
| 4,680,527 | 7/1987 | Benenati et al. | 320/112 |
| 5,283,511 | 2/1994 | Keener et al. | 320/110 |
| 5,635,814 | 6/1997 | Afzal et al. | 320/111 |
| 5,754,027 | 5/1998 | Oglesbee et al. | 320/122 |
| 5,905,441 | 5/1999 | Klee et al. | 340/815.4 |

*Primary Examiner*—Donald Sparks
*Assistant Examiner*—John B. Vigoshin
*Attorney, Agent, or Firm*—Zarley, McKee, Thomte, Voorhees & Sease; Dennis L. Thomte

[57] ABSTRACT

A flexible circuit board includes a plurality of discrete circuits for use with different types of rechargeable battery packs. Conductive traces formed on the circuit board include gaps which cause certain portions of the circuitry to be disconnected from the circuit rendering that portion of the circuit inactive. The process of bridging the gaps by attaching one or more components over the gaps causes the corresponding inactive portion of the circuit to be activated. By selectively activating certain portions of the circuit, a desired result is obtained.

23 Claims, 5 Drawing Sheets

5,999,410

FLEXIBLE CIRCUIT BOARD CONFIGURABLE FOR USE WITH DIFFERENT TYPES OF BATTERY PACKS

BACKGROUND OF THE INVENTION

1. Field of the Invention

The present invention relates to battery packs for portable devices. More particularly, though not exclusively, the present invention relates to a method and apparatus for providing a flexible circuit board with combined mechanical and electrical points of connection to other components in an electromechanical system.

2. Problems in the Art

Prior art flexible printed circuit boards typically consist of copper foil laminated between layers of flexible, non-conductive film. Voids in either layer of the non-conductive film expose the copper foil and serve as attachment points, via soldering, for the various electronic components which will be connected to the circuit. By selectively removing portions of the copper film during manufacturing, separate current carrying paths, or traces, are created in the foil. The traces connect various electronic components mounted on the circuit board.

Prior art circuit boards are typically designed for a specific application, and may be usable in other similar applications if the arrangement and/or content of electronic components mounted on the circuit board are varied to accommodate the other application. This variation causes the creation of circuit board designs which are distinct from each other and are not interchangeable. Each distinct design functions in a way unique to the configuration of the circuit traces and electronic components. As a result, a unique circuit board design exists for each unique functional application. This creates the need to design, manufacture, and inventory each of the unique circuit board designs which results in higher costs (mainly due to lower purchasing volumes and increased inventory carrying costs) for manufacturers utilizing these circuit boards in their products.

The basic components of a typical rechargeable battery pack include 2–12 rechargeable series-connected cells, other related electronic components, and a plastic case enclosing the cells and components. The battery pack case is usually fitted with metal contacts (device contacts) which serve as points of electrical connection between the cells inside the case an electrical power consuming device on the outside of the case. In addition, the metal contacts (charge contacts) serve as points of electrical connection between the cells and an electrical power supplying device (charger) on the outside of the case for the purpose of recharging the battery cells. Other common electronic components in a battery pack include a thermister for monitoring the temperature inside the battery pack and a diode for preventing the accidental discharge of the cells through the charge contacts.

FIG. 1 is an electrical schematic diagram of a typical prior art battery pack. As shown, a number of cells 10 are electrically connected to a positive current trace 12 and to a negative current trace 14 via cell contacts 13 and 15, respectively. The traces 12 and 14 are electrically connected to a pair of device contacts 16, 18 and a pair of charge contacts 20, 22.

The capacity and type of the cells are used by the charging device to determine the ideal rate of charging current delivered to the cells. Many charging devices are designed to charge battery packs with various types of cells. A common method used to enable the charger to determine the charging requirements of the cells in a given battery pack involves the use of a sense resistor having a specific resistance.

FIG. 2 is an electrical schematic diagram of a battery pack utilizing a sense resistor $R_s$. The charging device (not shown) connects to the battery pack via charge contacts 20 and 22. The charging device also connects to a charger sense resistor contact 24. The charging device is then capable of detecting the resistance value of the sense resistor $R_s$ in the battery pack. The charging device is programmed to provide an appropriate charging current for the pack depending on the value of the sense resistor $R_s$. For example, a battery pack having a low capacity may be built with a sense resistor $R_s$ of a specific value (e.g., 20k Ω), while a battery pack having a high capacity may be built with a sense resistor $R_s$ of a specific, but different, value (e.g., 10k Ω).

FIG. 3 shows one embodiment of a flexible circuit board 26 designed in accordance with FIG. 2. The circuit board 26 is comprised of copper foil 27 (FIG. 5) disposed between sheets of flexible non-conductive film 28 (FIG. 5). The copper foil further comprises positive and negative current traces 12 and 14 which connect to cells (not shown) via cell contacts 13 and 15, respectively. The traces 12 and 14 connect to a device (not shown) via the device contacts 16 and 18, respectively. The traces 12 and 14 also connect to a charging device (not shown) via the charge contacts 20 and 22, respectively. The charging device also connects to the sense resistor $R_s$ via the sense resistor contact 24. The contacts 16, 18, 20, 22, and 24, are comprised of circular portions of the copper foil with no flexible non-conductive film disposed thereon, therefore exposing the foil on one side of the circuit board. A hole is formed in the center of each contact.

A common method of designing external contacts is to use rivets to secure the circuit board to the battery case. FIGS. 4–7 illustrate how rivets 32 are used to secure the flexible circuit board 26 to the battery pack case 34, while, at the same time, providing an electrical contact point. The head of the rivets 32 form the device/charger interface surface on the outside of the battery pack case 34 by passing through the plastic case 34 and through the flexible circuit board 26.

FIG. 4 is an exploded view of the circuit board 26, the plastic battery pack case 34, a rivet 32 and a washer 36. As shown, the case 34 include a number of holes 38, 40, 42, 44, and 46 which correspond to the holes formed in the contacts 16, 18, 20, 22, and 24, respectively. When the circuit board 26 is inserted into the case 34, rivets 32 are inserted through the holes and contacts.

FIGS. 5–7 are enlarged sectional views illustrating the insertion of the rivet 32 through a hole forming a contact. All of the contacts are formed in an identical manner. As shown, a rivet 32 is inserted through the hole formed in the case 34, the circuit board 26, and the washer 36. FIG. 6 shows a staking tool 48 which is used to secure the rivet 32 in place. By subjecting the shank of the rivet 32 to a staking process, the shank of the rivet 32 is deformed (FIG. 7) so that it overlaps onto the non-insulated portion of the copper foil 27 on the flexible circuit board 26. The copper foil 27 is therefore electrically connected to the rivet 32. To further improve the integrity of the electrical contact between the trace and the overlapping rivet 32, the washer 36 (flat or toothed) is located between the rivet and the copper foil to increase the surface area available to conduct current through the junction.

FEATURES OF THE INVENTION

A general feature of the present invention is the provision of a method and apparatus for providing a flexible circuit board that overcomes problems found in the prior art.

A further feature of the present invention is the provision of a method and apparatus for providing a flexible circuit board which is designed with multiple discrete circuits for use in different applications.

Further features, objects, and advantages of the present invention include:

A method and apparatus for providing a flexible circuit board which may be utilized with various types of battery packs.

A method and apparatus for providing a flexible circuit board with a battery pack which includes multiple sense resistors for allowing a device to identify the type of battery cells in the pack.

A method and apparatus for providing a flexible circuit board for a device which includes multiple discrete circuits which are selectively utilized depending the device to which the circuit board is attached.

These as well as other features, objects and advantages of the present invention will become apparent from the following specification and claims.

SUMMARY OF THE INVENTION

A configurable circuit board of the present invention is usable with different types of devices. The invention is comprised of a circuit board having a plurality of mounting points for mounting the circuit board to a device. The circuit board includes a plurality of components electrically connected to the circuit board. A subset of the plurality of components is enabled depending on which of the plurality of mounting points are used to mount the circuit board to the device.

DETAILED DESCRIPTION OF THE PREFERRED EMBODIMENT

The present invention will be described as it applies to its preferred embodiment. It is not intended that the present invention be limited to the described embodiment. It is intended that the invention cover all alternatives, modifications, and equivalencies which may be included within the spirit and scope of the invention.

Battery packs are typically designed to have multiple versions. However, for the purposes of this description, a battery pack with two versions (a low capacity version and a high capacity version) will be described. The two versions of the present invention share similar outside dimensions and features except for the height of the batter pack, which is greater for the high capacity battery pack due to the longer length of the cells. The flexible circuit board of the present invention (described below) is designed to be used with both versions to reduce tooling and inventory costs.

Figure 8:
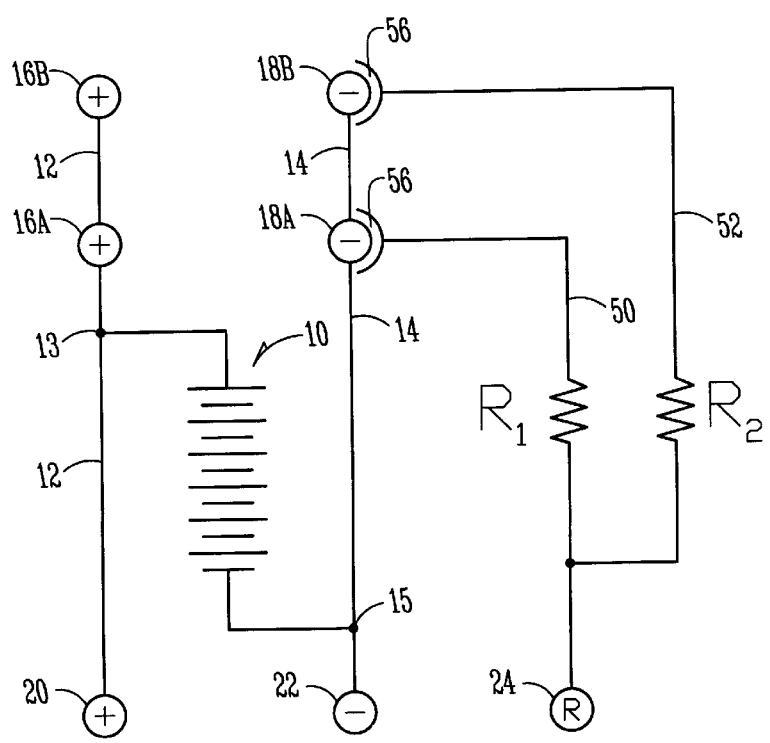
FIG. 8 is an electrical schematic diagram of a rechargeable battery pack of the present invention.

FIG. 8 is an electrical schematic diagram of the flexible circuit board. A number of cells 10 are electrically connected to a positive current trace 12 and to a negative current trace 14 via cell contacts 13 and 15, respectively. The traces 12 and 14 are electrically connected to a pair of charge contacts 20 and 22. The traces 12 and 14 are also connected to a first pair of low capacity device contacts 16A and 18A as well as a second pair of high capacity device contacts 16B and 18B. As shown, the circuit includes two sense resistors R1 and R2, which allow the charger to identify the type of cells in the battery pack. The circuit includes a charger sense resistor contact 24 which is connected to both sense resistors R1 and R2. The sense resistors R1 and R2 are connected to sense resistor traces 50 and 52, respectively. The traces 50 and 52 are routed near, but do not touch, the areas of the negative current trace 14, which help to form the connection points 18A and 18B. The contact rivets 32 and washers 36, when installed, act as switches with the circuit to the desired sense resistor R1 or R2 when the contact rivet 32 and washer 36 are assembled to the case 34 and circuit board (described below).

Figure 9:
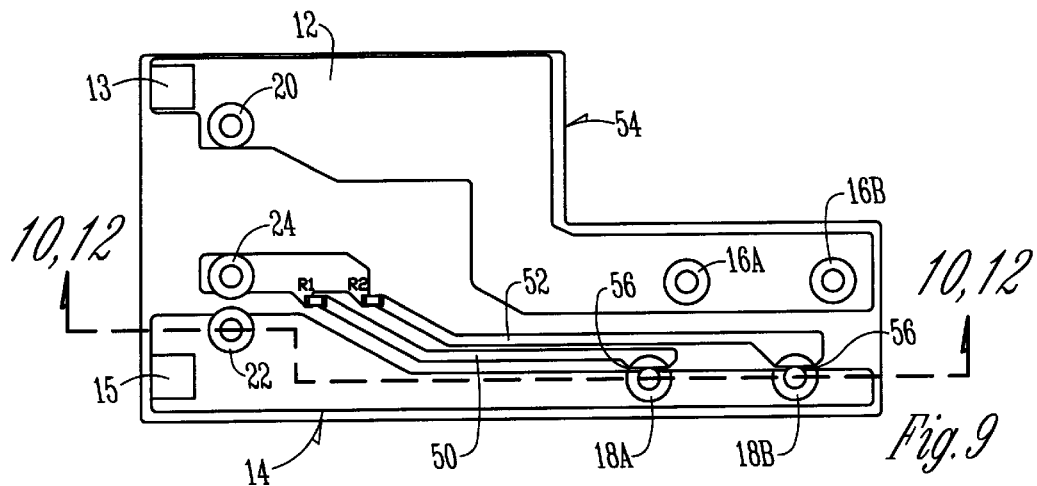
FIG. 9 is a view of the flexible circuit board of the present invention.

FIG. 9 illustrates a flexible circuit board 54 designed in accordance with the schematic of FIG. 8. The circuit board is designed to fit into either a short battery pack case (low capacity) or a long battery pack case (high capacity). The type of battery pack (low or high capacity) being built determines the contact rivet/washer attachment points used (described below).

Figure 10:
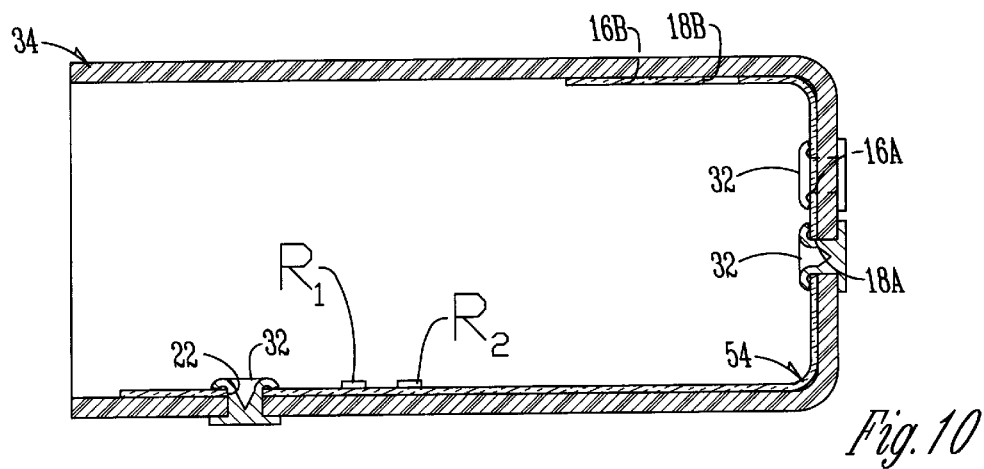
FIG. 10 is a sectional view of the flexible circuit board shown in FIG. 9 attached to a short battery pack housing.

When the circuit board 54 is used in a low capacity battery pack, the low capacity contact points 16A and 18A are used. FIG. 10 is a sectional view of a low capacity battery pack 34 (without the cells 10) showing the attachment points used when it is installed in a low capacity pack. As shown, the circuit board 54 is bent at two places so that the low capacity contact points 16A and 18A are positioned at the end of the case 34.

Figure 1:
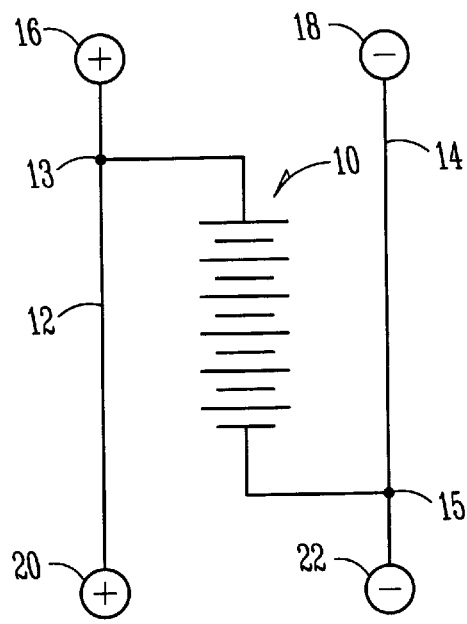
FIG. 1 is an electrical schematic diagram of a typical rechargeable battery pack.
Figure 2:
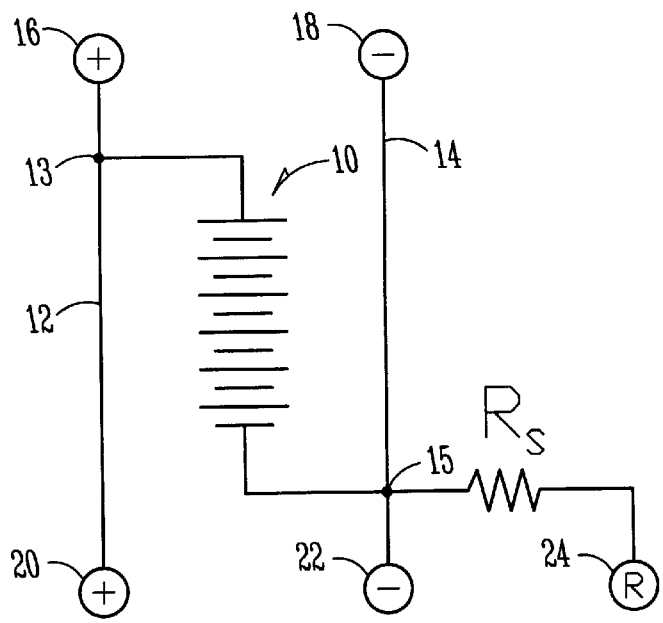
FIG. 2 is an electrical schematic diagram of a rechargeable battery pack having a sense resistor.
Figure 3:
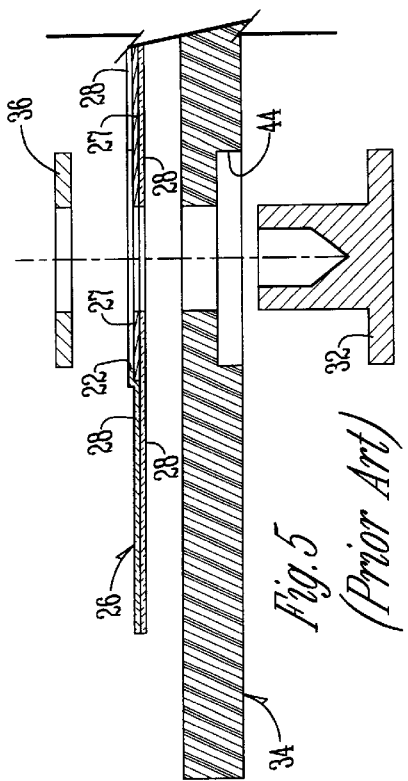
FIG. 3 is a diagram of a prior art flexible circuit board.
Figure 5:
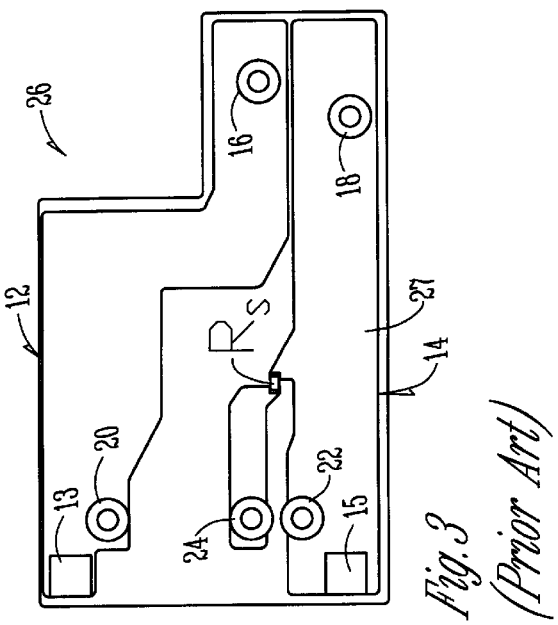
FIGS. 5–7 are sectional views illustrating the formation of contacts using a rivet.
Figure 4:
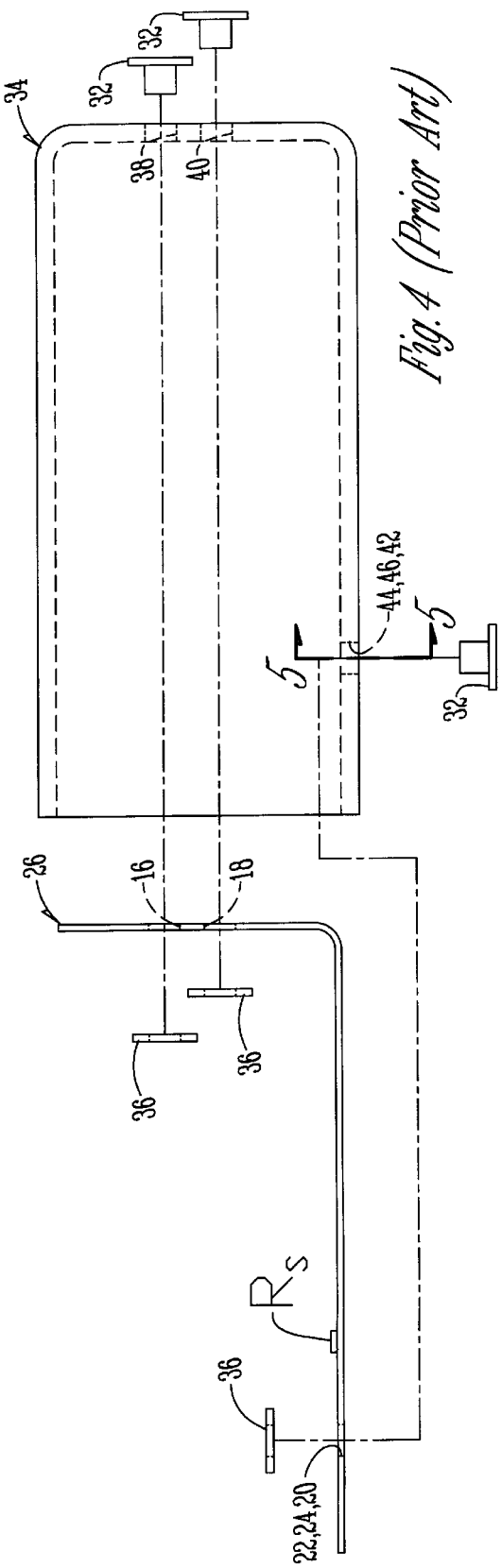
FIG. 4 is an exploded view of a prior art flexible circuit board and a battery pack case.
Figure 6:
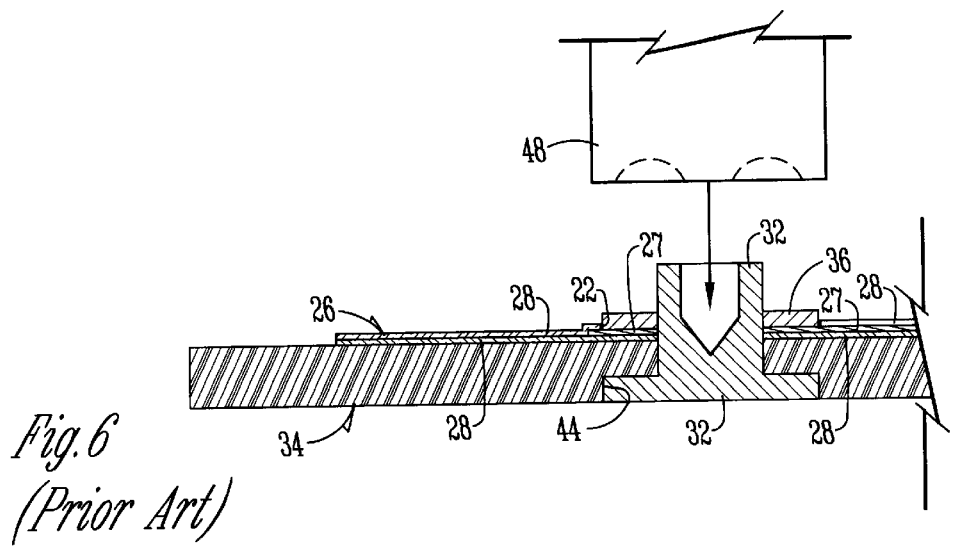
Figure 7:
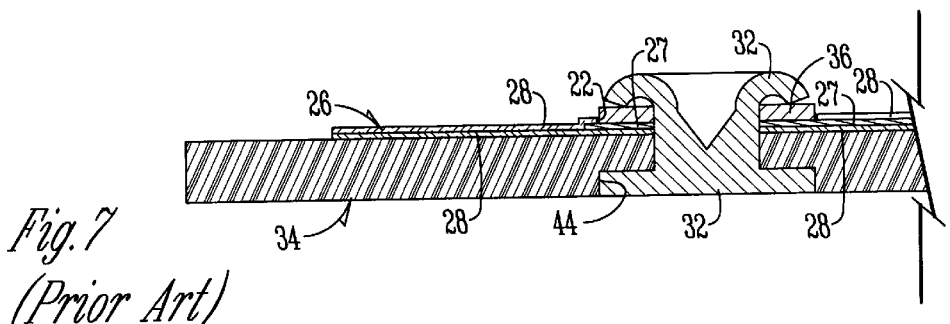

Referring back to FIGS. 8 and 9, a gap 56 is formed between the negative current trace 14 and the sense resistor traces 50 and 52. The gaps 56 create an open circuit between the trace 14 and the traces 50 and 52. However, when the contact rivet 32 and washer 36 are installed through the holes in contacts 18A or 18B (see FIGS. 5–7), the gap 56 between the trace 14 and the trace 50 or 52 is bridged by the washer 36, shorting the traces together.

Figure 11:
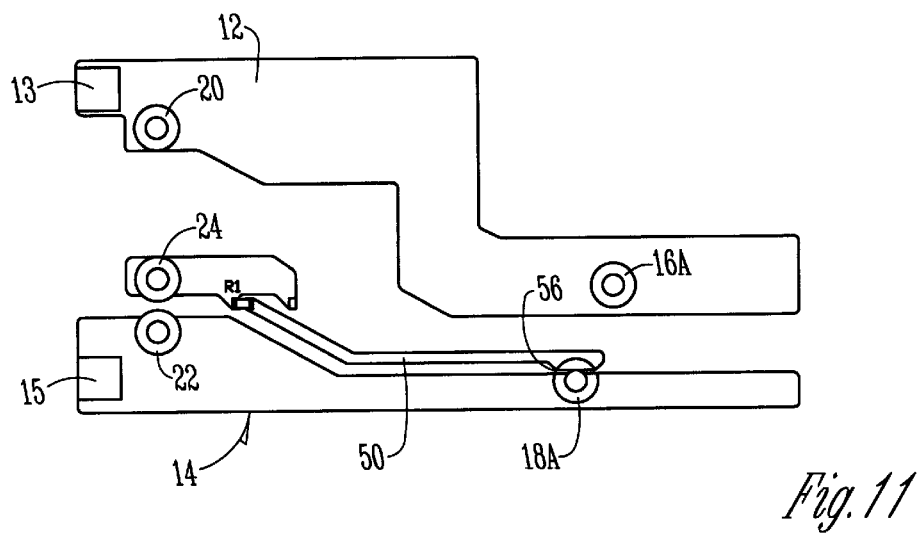
FIG. 11 is a view of the active circuit traces of the flexible circuit board shown in FIG. 10.

When the rivet 32 and washer 36 are installed through the hole in contact 18A (FIG. 10), the portion of the circuit containing sense resistor R1 becomes a closed loop allowing the charger, which connects to the circuit at contacts 20, 22, and 24, to be connected to the sense resistor R1. FIG. 11 is a diagram showing only the active circuit traces when the circuit board 54 is installed into a low capacity battery pack. As shown, the sense resistor R1 is connected to the sense resistor contact 24, while the sense resistor R2 is not. The charger, therefore, is able to identify the pack as a low capacity pack because of the resistance of sense resistor R1. The charger is then able to charge the pack in the proper manner.

Figure 12:
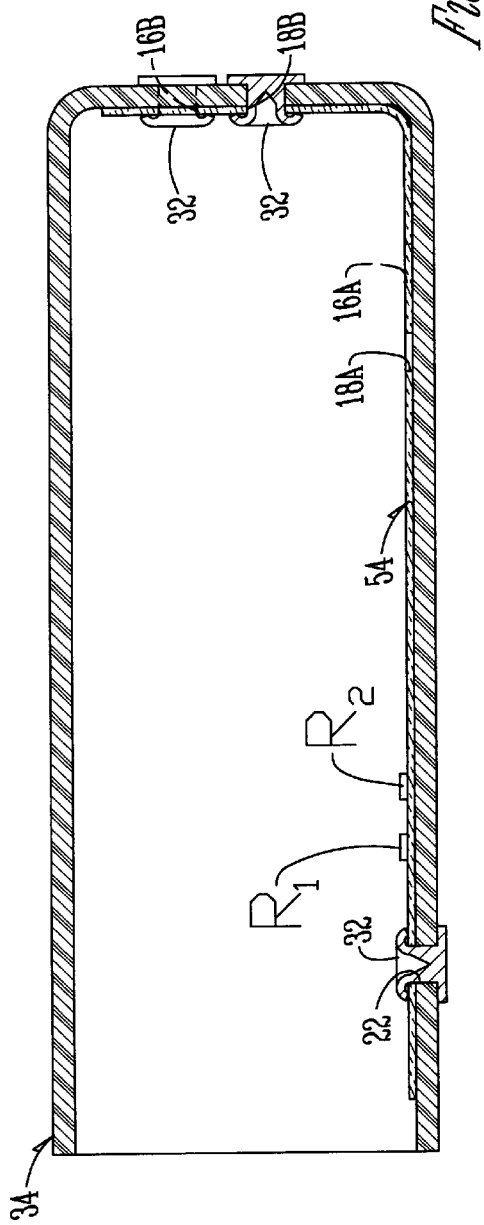
FIG. 12 is a sectional view of the flexible circuit board shown in FIG. 9 attached to a long battery pack housing.

When the circuit board 54 is used in a high capacity battery pack, the high capacity contact points 16B and 18B are used. FIG. 12 is a sectional view of a high capacity battery pack (without the cells 10) showing the attachment points used when it is installed in a high capacity pack. As shown, the circuit board 54 is bent at one place so that the high capacity contact points 16B and 18B are positioned at the end of the case 34.

Figure 13:
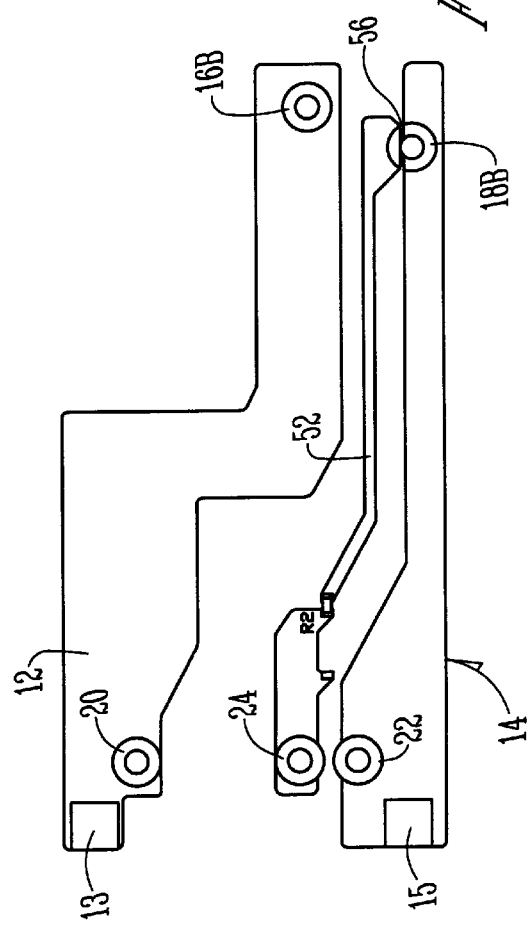
FIG. 13 is a view of the active circuit traces of the flexible circuit board shown in FIG. 11.

When the rivet 32 and washer 36 are installed through the hole in contact 18B (FIG. 12), the portion of the circuit containing sense resistor R2 becomes a closed loop allowing the charger, which connects to the circuit at contacts 20, 22, and 24, to be connected to the sense resistor R2. FIG. 13 is a diagram showing only the active circuit traces when the circuit board 54 is installed into a high capacity battery pack. As shown, the sense resistor R2 is connected to the sense resistor contact 24, while the sense resistor R1 is not. The charger, therefore, is able to identify the pack as a high capacity pack because of the resistance of sense resistor R2. The charger is then able to charge the pack in the proper manner.

As can be seen, a single flexible circuit board 54 can be used in multiple applications which are different in their circuit requirements. The required electronic components are incorporated into the circuit automatically when the circuit board 54 is assembled to the mating components. A cost savings can be realized through lower part procurement cost and reduced inventory and material handling costs.

The present invention may include several alternatives to that described. For example, a rigid circuit board designed for use with multiple applications could also be used.

The preferred embodiment of the present invention has been set forth in the drawings and specification, and although specific terms are employed, these are used in a generic or descriptive sense only and are not used for purposes of limitation. Changes in the form and proportion of parts as well as in the substitution of equivalents are contemplated as circumstances may suggest or render expedient without departing from the spirit and scope of the invention as further defined in the following claims.

What is claimed is:

1. A configurable circuit board for use with different types of rechargeable battery packs comprising:
   a circuit board having a plurality of mounting points for mounting the circuit board to a battery pack; and
   a plurality of components electrically connected to the circuit board, wherein differing subsets of the plurality of components are enabled depending on which of the plurality of mounting points are used to mount the circuit board to the battery pack.

2. The configurable circuit board of claim 1, wherein the circuit board is mounted to the battery pack using rivets.

3. The configurable circuit board of claim 1, wherein the circuit board is comprised of a rigid circuit board.

4. A configurable circuit board for use with different types of rechargeable battery packs comprising:
   a circuit board having a plurality of mounting points for mounting the circuit board to a battery pack;
   a plurality of components electrically connected to the circuit board, wherein a subset of the plurality of components is enabled depending on which of the plurality of mounting points are used to mount the circuit board to the battery pack; and
   a plurality of gaps formed between a plurality of electrically conductive traces, wherein the subset is enabled by providing a short between the gap when the circuit board is mounted to the battery pack.

5. A configurable circuit board for use with different types of rechargeable battery packs, comprising:
   a circuit board having a plurality of mounting points for mounting the circuit board to a battery pack;
   a plurality of components electrically connected to the circuit board, wherein a subset of the plurality of components is enabled depending on which of the plurality of mounting points are used to mount the circuit board to the battery pack; and
   the plurality of components including a number of sense resistors for enabling a charging device to identify the type of battery pack.

6. A configurable circuit board for use with different types of rechargeable battery packs comprising:
   a circuit board having a plurality of mounting points for mounting the circuit board to a battery pack;
   a plurality of components electrically connected to the circuit board, subset wherein a of the plurality of components is enabled depending on which of the plurality of mounting points are used to mount the circuit board to the battery pack; and
   the circuit board being mounted to the battery pack by rivets that provide external electrical contact points for the battery pack for connection to an external device.

7. The configurable circuit board of claim 6, wherein at least one of the rivets provides an electrical short between one of the plurality of components and one of the electrical contact points.

8. The configurable circuit board of claim 7, wherein the plurality of components include at least two sense resistors for enabling a charging device to identify the type of battery pack.

9. A configurable circuit board for use with different types of rechargeable battery packs comprising:
   a circuit board having a plurality of mounting points for mounting the circuit board to a battery pack;
   plurality of components electrically connected to the circuit board, wherein a subset of the plurality of components is enabled depending on which of the plurality of mounting points are used to mount the circuit board to the battery pack; and
   the circuit board is comprised of a flexible circuit board.

10. A circuit board for use with multiple applications, comprising:
    a circuit board;
    a plurality of components mounted to the circuit board; and
    a selection device comprising a battery pack operatively connected to said plurality of components for selectively enabling differing subsets of the plurality of components to obtain a desired result, wherein a selected one of the differirng subsets allows an external device to determine the type of the battery pack.

11. The selection device of claim 10, wherein the selected subset includes a sense resistor, and wherein the value of the selected sense resistor corresponds to a battery pack type.

12. A circuit board for multiple application comprising:
    a circuit board;
    a plurality of components mounted to the circuit board; and
    a selection device operatively connected to said plurality of components for selectively connecting a subset of the plurality of components together to obtain a desired result;

said selection device comprising a fastener which provides an electrical short between two of the components.

13. A circuit board for use with multiple applications, comprising:

a circuit board;

a plurality of components mounted to the circuit board; and a selection device comprising a fastener which provides an electrical short between two of the components operatively connected to said plurality of components for selectively enabling differing subsets of the plurality of components to obtain a desired result.

14. A circuit board for use with multiple applications comprising:

a flexible circuit board;

a plurality of components mounted to the flexible circuit board; and a selection device operatively connected to said plurality of components for selectively enabling differing subsets of the plurality of components to obtain a desired result.

15. The selection device of claim 14, wherein the device is comprised of a battery pack.

16. A method of assembling a plurality of types of rechargeable battery packs comprising the steps of:

providing a flexible circuit board having at least two sense resistors for allowing a charging device to identify the type of cells in the battery pack;

providing a plurality of mounting points on the flexible circuit board;

selecting at least one of the plurality of mounting points, depending on the type of cells used in the battery pack; and mounting the flexible circuit board to the battery pack using the selected mounting points such that an electrical connection is made between the mounting point and at least one of the sense resistors.

17. The method of claim 16, wherein the step of mounting the flexible circuit board to the battery pack further comprising the steps of:

inserting a rivet through the selected mounting point on the circuit board and through a battery pack housing; and making an electrical connection between the rivet and one or more traces formed on the circuit board to form an external connection point for use by an external device.

18. The method of claim 17, wherein the rivet makes electrical contact with one of the sense resistors to allow the external device to determine the resistance value of the connected sense resistor.

19. The method of claim 17, wherein the installation of the rivet creates a short between two adjacent traces on the circuit board.

20. A method of assembling a plurality of types of rechargeable battery packs comprising the steps of:

providing a flexible circuit board having at least two sense resistors for allowing a charging device to identify the type of cells in the battery pack;

providing a plurality of mounting points on the flexible circuit board, each of the mounting points corresponding to a certain type of battery pack and to one of the sense resistors;

selecting a battery pack housing corresponding to a desired type of battery pack; and mounting the flexible circuit board to the selected battery pack housing at the corresponding mounting point while making an electrical connection to the corresponding sense resistor.

21. The method of claim 20, further comprising the step of forming a plurality of electrically conductive traces on the circuit board, wherein each of the mounting points is electrically connected to at least one of the traces.

22. The method of claim 21, wherein the step of mounting the flexible circuit board to the selected battery pack housing at the corresponding mounting point while making an electrical connection to the corresponding sense resistor is accomplished by providing a short between two adjacent conductive traces in the proximity of the corresponding mounting point.

23. The method of claim 22, wherein the short is provided by installing a rivet through the battery pack housing and the circuit board.

* * * * *